(12) United States Patent
Suzuki et al.

(10) Patent No.: US 7,098,104 B2
(45) Date of Patent: Aug. 29, 2006

(54) METHOD OF FABRICATING SEMICONDUCTOR MEMORY DEVICE

(75) Inventors: Junichi Suzuki, Kanagawa (JP); Kohji Kanamori, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 302 days.

(21) Appl. No.: 10/822,676

(22) Filed: Apr. 13, 2004

(65) Prior Publication Data

US 2004/0209424 A1    Oct. 21, 2004

(30) Foreign Application Priority Data

Apr. 17, 2003    (JP)    .............................. 2003-112449

(51) Int. Cl.
*H01L 21/336*    (2006.01)
(52) U.S. Cl. ...................... 438/257; 438/264; 438/266; 257/E29.129
(58) Field of Classification Search ................ 438/257, 438/264, 266
See application file for complete search history.

(56) References Cited

FOREIGN PATENT DOCUMENTS

| JP | 10-294367 | 11/1998 |
|---|---|---|
| JP | 11-121638 | 4/1999 |
| JP | 2000-40754 | 2/2000 |

*Primary Examiner*—David S. Blum
(74) *Attorney, Agent, or Firm*—Young & Thompson

(57) ABSTRACT

A silicon layer doped with an impurity for a floating gate, a protective layer, a silicon nitride layer of a laminated hard mask and a first NSG layer are formed into a desired pattern, on which a second NSG layer is formed and left as a side wall. With the second NSG layer as a mask, the silicon nitride layer is etched. Using the remaining silicon nitride layer as a mask, the silicon layer is etched to form a silicon pattern whose surface is covered with a second protective layer, and the silicon nitride layer is etched out. Accordingly, it is possible to prevent a damage at the surface of the floating gate at the time of forming the floating gate using doped polysilicon.

11 Claims, 10 Drawing Sheets

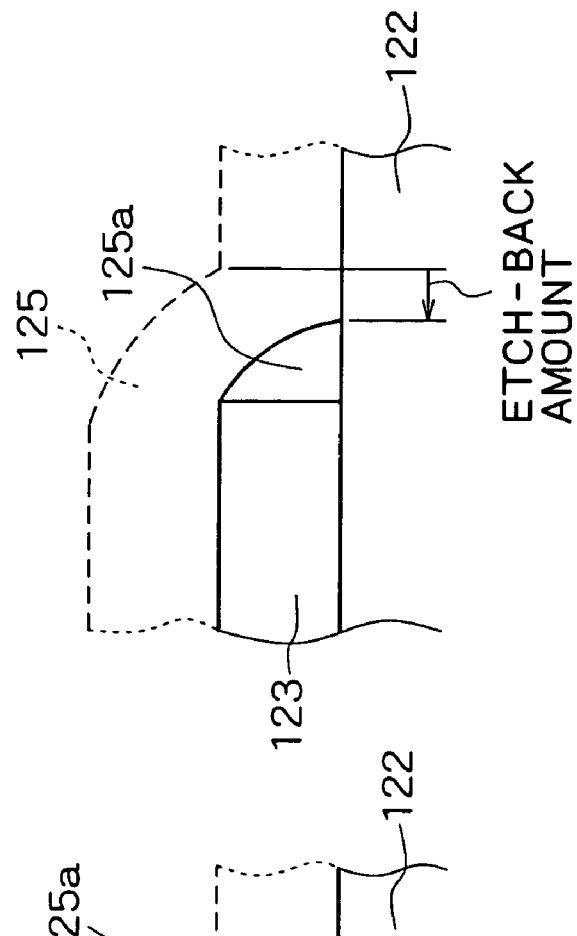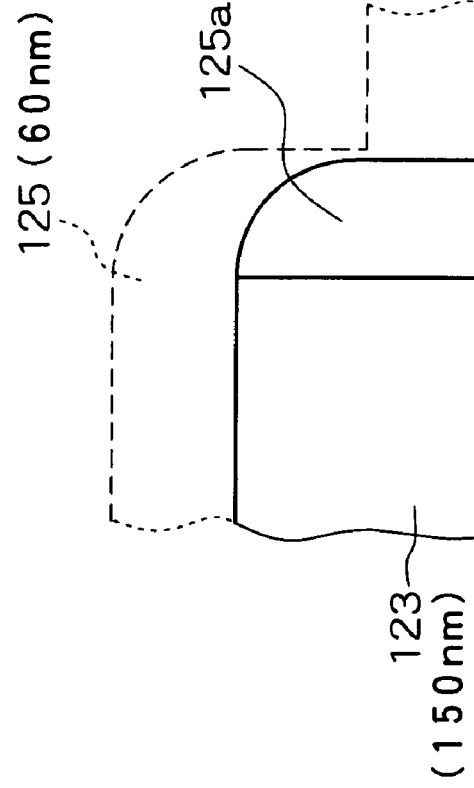

METHOD OF FABRICATING SEMICONDUCTOR MEMORY DEVICE

BACKGROUND OF THE INVENTION

1. Field of the Invention

The present invention relates to a method of fabricating a semiconductor memory device including stacked-gate nonvolatile memory cells having a floating gate and a control gate.

2. Description of the Related Art

A semiconductor device such as a flash memory which is recently used in a memory card or so comprises stacked-gate nonvolatile memory cells with an MOS structure wherein each memory cell has a floating gate and a control gate laminated. In this type of memory cell, data recording or erasure or so-called programming is accomplished as the threshold value of the memory cell is changed by storing charges stored in the floating gate through a tunnel oxide layer directly underlying the floating gate or removing the stored charges. It is known that to execute programming adequately, particularly, to improve the erasure characteristic or reduce the erasure voltage, the capacitor between the floating gate and the control gate should preferably be increased. As one way to achieve it, an attempt has been made to make the opposing areas of those gates larger as much as possible.

However, the layout pitch of memory cells is tended to become smaller to meet a demand of increasing the memory capacity. To make the area of the floating gate larger as much as possible within the restriction of the layout pitch, the interval between the adjoining floating gates should be made narrower. It is however difficult to achieve the narrower interval from the viewpoint of the resolution of the photolithography technology at the time of fabricating the floating gate. Japanese Patent Laid-Open Publication No. 2000-40754 proposes, as a solution to this problem, a technique of forming spacers on both sides of a mask (called hard mask) at the time of fabricating the floating gate by photolithography technology, thereby narrowing the interval between the adjoining hard masks and forming a floating gate pattern using the hard masks.

The technique proposed in Japanese Patent Laid-Open Publication No. 2000-40754 is illustrated in FIGS. 1A to 1C and FIGS. 2A and 2B. Those diagrams are cross-sectional views of a memory cell having an MOS structure in the channel direction. The following discusses the process step by step. First, as shown in FIG. 1A, a device-forming insulating layer 201 is formed on a silicon substrate 200 to define a device forming region, then a tunnel oxide layer 202 is formed at the surface of the silicon substrate 200. Next, a first polysilicon layer 203 for formation of a floating gate, a silicon nitride layer 204 as a protective layer, and a second polysilicon layer 205 as a mask layer are deposited on the entire surface, and a photoresist pattern 206 for formation of a floating gate pattern is formed on the resultant surface. The photoresist pattern 206 reduces the interval between adjoining patterns to a size close to the resolution limit of the photolithography technology.

Next, with the photoresist pattern 206 used as a mask, the second polysilicon layer 205 is selectively etched to form a second polysilicon pattern 205a, the photoresist pattern 206 is removed, then a third polysilicon layer 207 is formed on the entire surface, as shown in FIG. 1B. Then, the third polysilicon layer 207 is subjected to anisotropic dry etching, thus forming a third polysilicon side wall 207a on a side surface of the second polysilicon pattern 205a. Accordingly, a hard mask is formed by the second polysilicon pattern 205a and the third polysilicon side wall 207a and the interval between the adjoining hard masks becomes equal to or smaller than the resolution of the photolithography technology.

Next, as shown in FIG. 1C, using the hard mask comprised of the second polysilicon pattern 205a and the third polysilicon side wall 207a, the protective layer 204 is dry-etched to form a protective layer pattern 204a.

Subsequently, as shown in FIG. 2A, with the etcher changed, the first polysilicon layer 203 is dry-etched to form a first polysilicon layer pattern 203a. At this time, the second polysilicon pattern 205a and the third polysilicon side wall 207a are removed by the dry etching process, and the first polysilicon layer 203 is etched with the protective layer pattern 204a used as a mask. Therefore, the first polysilicon layer pattern 203a is also patterned to have the interval equal to or smaller than the resolution of the photolithography technology. Next, the protective layer pattern 204a is removed by wet etching.

Thereafter, a capacitance insulating layer 208 is formed on the first polysilicon layer pattern 203a and a fourth polysilicon layer 209 is formed on the capacitance insulating layer 208, as shown in FIG. 2B. A photoresist pattern is formed on the fourth polysilicon layer 209, and the fourth polysilicon layer 209, the capacitance insulating layer 208 and the first polysilicon layer pattern 203a are etched in order using the photoresist pattern 124 as a mask, thereby forming a word line as the control gate with the fourth polysilicon layer 209 and forming a floating gate with the first polysilicon layer pattern 203a, though not illustrated. Further, ions of an N-type impurity are injected into the device forming region by self-alignment using those gates as masks, thereby forming a source region and a drain region. This completes the fabrication of a memory cell.

According to the technique disclosed in Japanese Patent Laid-Open Publication No. 2000-40754, to suitably etch out the protective layer 204 lying over the first polysilicon layer 203 after etching the first polysilicon layer 203, the first polysilicon layer 203 is formed of non-doped polysilicon for the following reason. If doped polysilicon is used to provide the first polysilicon layer 203 with conductivity, the surface of the first polysilicon layer 203 is likely to be damaged at the time of etching the protective layer 204. The non-doped polysilicon is therefore used to prevent such a damage from remaining on the surface of the floating gate. However, the present inventor discovered through studies on the technique that even in case where the first polysilicon layer 203 is formed of non-doped polysilicon, some damage inevitably occurs if the etchant contacts the surface of the first polysilicon layer 203 at the time of etching the protective layer 204. Such a damage produces undulations at the surface of the floating gate fabricated finally, which would greatly affect the uniform thickness of the floating gate. This results in a variation in the amount of charges stored in the floating gate, i.e., a variation in the capacitance of the floating gate in each memory cell, disabling the provision of a semiconductor memory device with an improved erasure characteristic or a reduced erasure voltage.

The use of non-doped polysilicon for the first polysilicon layer 203 requires a process of doping an impurity in the first polysilicon layer 203 after the pattern formation in the process in FIG. 2A, and inevitably increases the number of fabrication processes as compared with the case where the first polysilicon layer 203 is formed of doped polysilicon from the beginning. Further, as the second and third polysilicon layers 205 and 207 are used as a hard mask at the time of forming the pattern of the protective layer 204, part of polysilicon remains as deposition on the surface of the protective layer 204 at the time of etching those polysilicon layers and the remained polysilicon interferes with the subsequent and adequate etching of the protective layer 204. In an extreme case, an unetched part of the protective layer remains on the surface of the fabricated floating gate and becomes a foreign matter at the time of forming the capacitance insulating layer to disable the formation of the uniform and high-quality capacitance insulating layer. The unetched part therefore becomes an obstacle in increasing the capacitance of the capacitor between the control gate and the capacitance insulating layer.

SUMMARY OF THE INVENTION

Accordingly, it is an object of the present invention to provide a fabrication method for a semiconductor memory device, which prevents a damage at the surface of a floating gate even if the floating gate is formed of doped polysilicon, ensures adequate programming of memory cells and reduces the number of fabrication processes.

A method of fabricating a semiconductor memory device according to the present invention includes the steps of forming a tunnel insulating layer in a device forming region defined in a semiconductor substrate; forming an impurity-doped silicon layer in the tunnel insulating layer; forming a protective layer at a surface of the silicon layer; laminating a lower layer and an upper layer of a laminated mask layer on the protective layer in order; forming the upper layer into a desired pattern; forming a second upper layer on the pattern of the upper layer; etching the second upper layer and leaving the second upper layer only on a side surface of the first upper layer; etching the lower layer using the first and second upper layers as masks; forming a silicon pattern by etching the silicon layer using the lower layer as a mask; forming a second protective layer covering a surface of the silicon pattern exposed; and etching out the lower layer.

In the invention, it is preferable that the fabrication method should further include the steps of removing the protective layer present at the surface of the silicon pattern after the step of etching out the lower layer; forming a capacitance insulating layer at the surface of the silicon pattern; forming a conductive layer on the capacitance insulating layer; and forming a control gate with the conductive layer and forming a floating gate with the silicon pattern by etching the conductive layer, the capacitance insulating layer and the silicon pattern in order into a desired pattern.

Further, it is preferable that the invention have the following characteristics.

(1) The silicon layer is a polysilicon layer or a metal polyside layer.
(2) The lower layer is a silicon nitride layer and the first and second upper layers are silicon oxide layers.
(3) The protective layer is a thermal oxidation silicon oxide layer obtained by subjecting the surface of the polysilicon layer to a heat treatment.
(4) The silicon nitride layer is etched out by a phosphoric acid solution.

In the invention, it is preferable that a thickness of the silicon nitride layer should be set greater than a sum of a thickness of the silicon nitride layer to be etched and a thickness of the silicon nitride layer to be etched at a time of etching of the polysilicon layer. In this case, the thickness of the first upper layer is set greater than the thickness of the second upper layer. Particularly, the thickness of the first upper layer is equal to or greater than twice the thickness of the second upper layer.

The invention can fabricate the floating gate to the size equal to or smaller than the resolution of the photolithography technology, making it possible improve the erasure characteristic and reduce the erasure voltage of a stacked-gate nonvolatile semiconductor memory device and to execute programming adequately. The formation of the protective layer that covers the silicon layer can prevent the surface of the silicon layer from being damaged at the time of etching out the lower layer of the laminated hard mask and thus ensure fabrication of a high-quality floating gate. What is more, an impurity-doped silicon layer can be used, thereby making it possible to reduce the number of fabrication processes.

According to the present invention, particularly, the size precision of the side wall which is formed by the second upper layer can be improved by forming the first upper layer for formation of the laminated hard mask thicker than the second upper layer, thereby improving the size precision of the floating gate. Particularly, the size precision of the side wall can be made extremely high by setting the thickness of the first upper layer twice the thickness of the second upper layer or greater, so that the floating gate can be fabricated with a very high precision.

As described above, as the invention includes the steps of forming a protective layer at the surface of a silicon layer for formation of a floating gate, depositing the lower layer and upper layer of a laminated hard mask on the protective layer in order, making the upper layer into a desired pattern, forming a side wall by the second upper layer, and etching the silicon layer using the side wall, thereby forming a silicon pattern, the floating gate can be fabricated with a size equal to or smaller than the resolution of the photolithography technology. This can ensure an improved erasure characteristic and a lower erasure voltage of a stacked-gate nonvolatile semiconductor memory device, so that programming can be executed adequately. As the protective layer that covers the silicon layer is formed, it is possible to prevent the surface of the silicon layer from being damaged at the time of etching out the lower layer of the laminated hard mask and thus ensure fabrication of a high-quality floating gate. What is more, an impurity-doped silicon layer can be used, thereby making it possible to reduce the number of fabrication processes. Further, the size precision of the side wall which is formed by the second upper layer can be improved by forming the first upper layer for formation of the laminated hard mask thicker than the second upper layer, thereby improving the size precision of the floating gate. Particularly, the size precision of the side wall can be made extremely high by setting the thickness of the first upper layer twice the thickness of the second upper layer or greater, so that the floating gate can be fabricated with a very high precision.

BRIEF DESCRIPTION OF THE DRAWINGS

FIGS. 10A and 10B are exemplary cross-sectional views illustrating the advantage brought about by the thickness of an NSG layer.

DETAILED DESCRIPTION OF THE PREFERRED EMBODIMENT

Figure 1A:
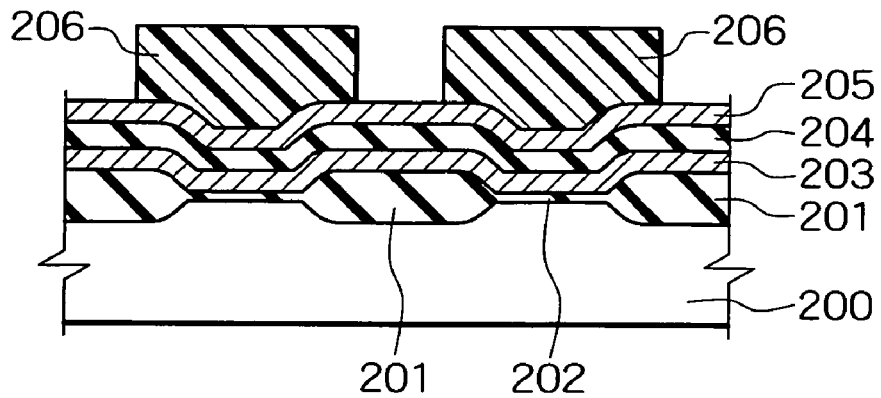
FIGS. 1A to 1C are cross-sectional views illustrating a conventional fabrication method process by process.
Figure 1B:
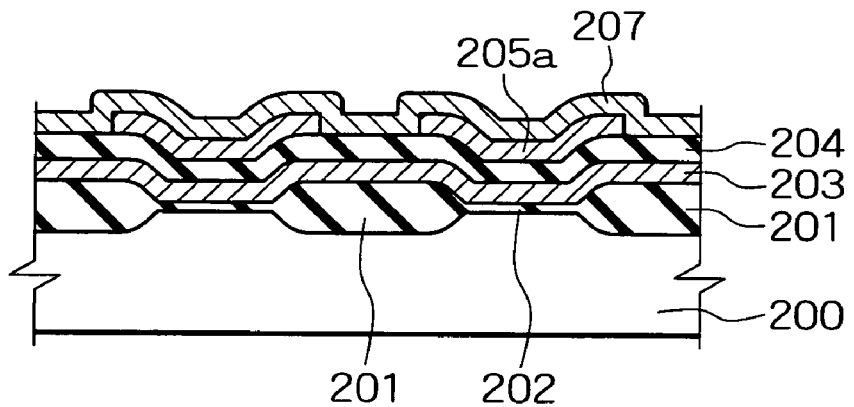
Figure 1C:
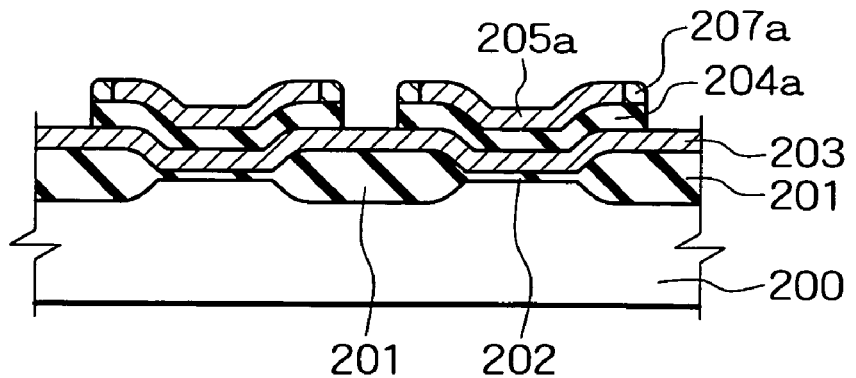
Figure 2A:
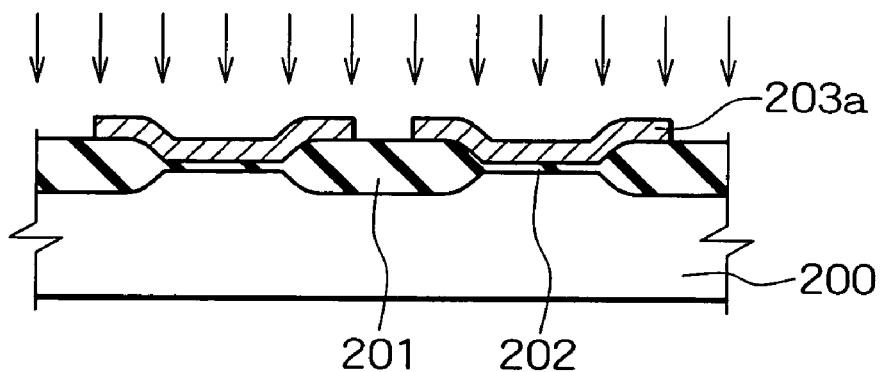
FIGS. 2A and 2B are cross-sectional views respectively illustrating processes following the process of FIG. 1C.
Figure 2B:
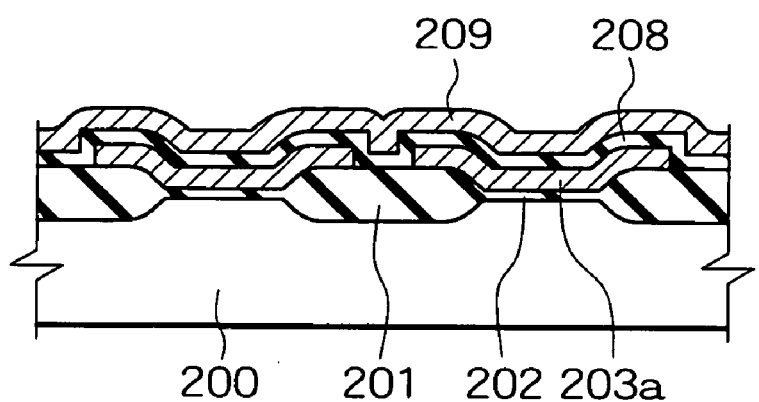
Figure 3:
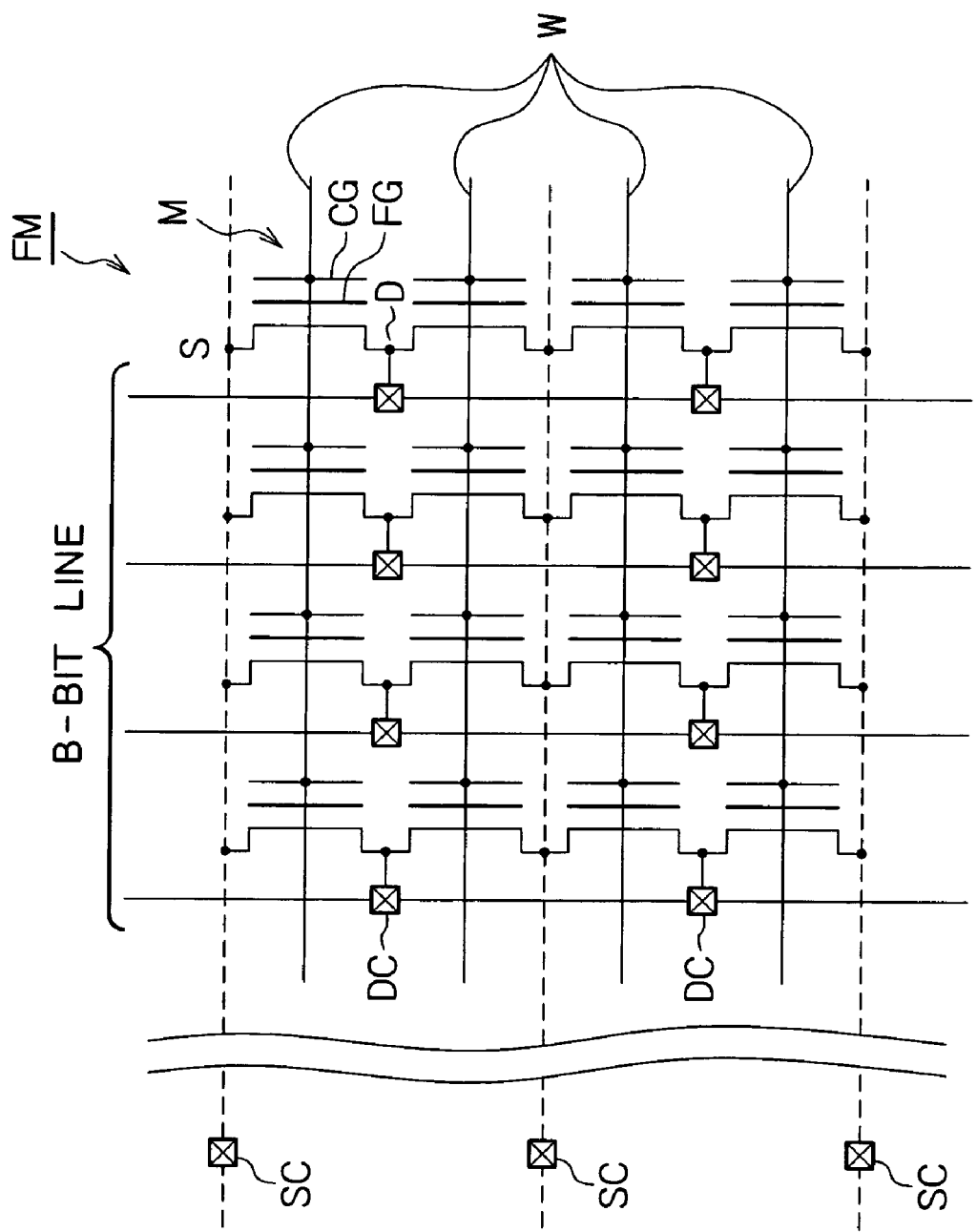
FIG. 3 is a circuit diagram of a semiconductor memory device according to the present invention.

One embodiment of the present invention will be described below with reference to the accompanying drawings. FIG. 3 is a circuit diagram of a semiconductor memory device according to the invention. A flash memory FM is comprised of a plurality of stacked-gate memory cells M each having a floating gate and a control gate. The memory cells M are laid out in a matrix form in such a way that the control gates CG of those memory cells M which are laid out in the row direction are connected to respective word lines W extending in the row direction. The source regions S or drain regions D of adjoining memory cells M in those memory cells M which are laid out in the column direction are constituted as a common source region or a common drain region.

Each common source region S of the memory cells laid out in the row direction extends and is connected to GND by source contacts SC laid out at desired pitches in the row direction. Drain contacts DC are provided in each common drain region D and the drain contacts laid out in the column direction are connected to bit lines B extending in the column direction.

Figure 4:
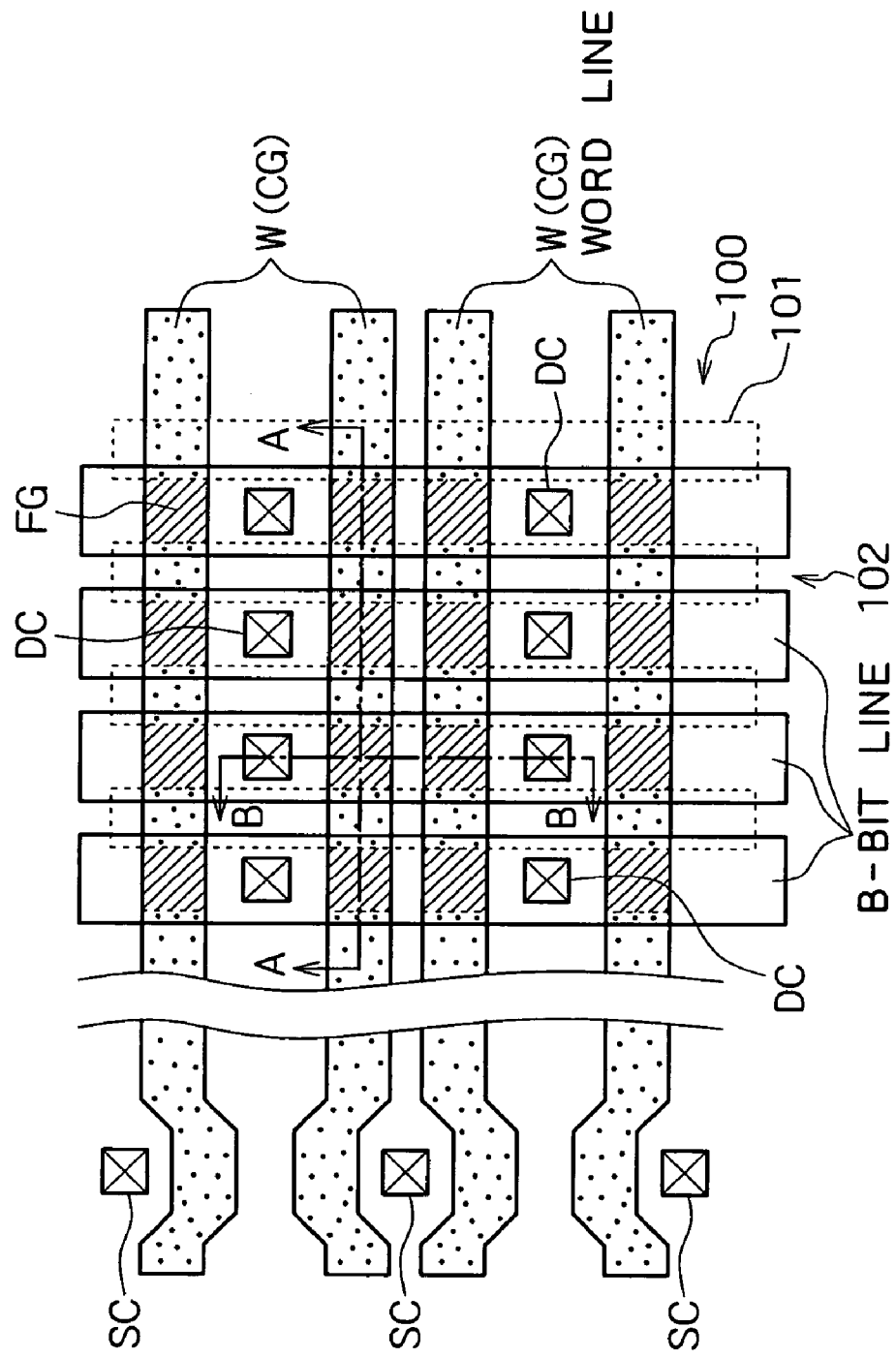
FIG. 4 is a layout plan view of the semiconductor memory device according to the invention.

FIG. 4 is a layout plan view corresponding to the circuit of the flash memory in FIG. 3. A device forming region 102 is defined by forming device isolation regions 101 on a silicon substrate 100 in a lattice pattern, and a word line W constituted also as the control gate CG extends above the device forming region 102 in the row direction. The floating gate FG is formed in a land shape on the device forming region 102 directly under the word line W. A channel region is located directly under the floating gate FG and individual diffusion layers of the source region S and the drain region D are formed on both sides in the column direction, thereby forming a memory cell M. The memory cells M adjoining in the row direction have the common source region S in whose part the source contact SC is provided. Bit contacts BC for connection to a bit line B are laid out in each common drain region D of the memory cells M adjoining in the column direction.

Figure 5A:
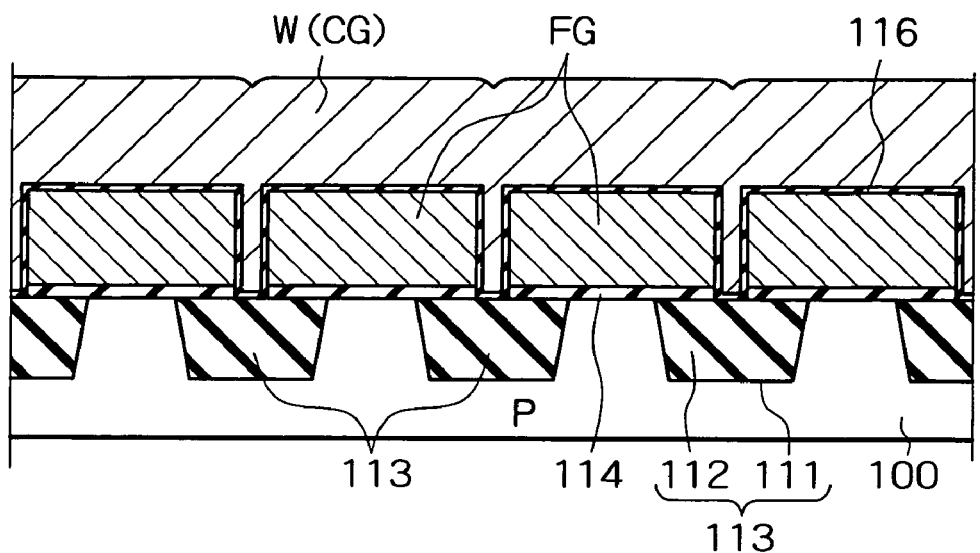
FIGS. 5A and 5B are cross-sectional views respectively taken along line A—A and line B—B in FIG. 4.
Figure 5B:
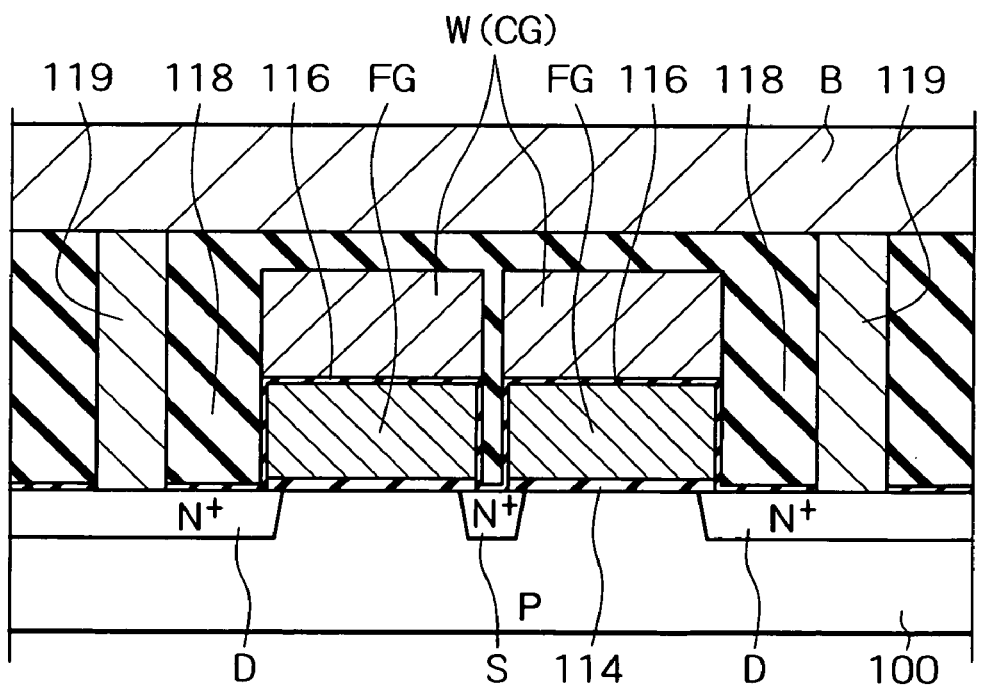

FIGS. 5A and 5B are cross-sectional views respectively taken along line A—A and line B—B in FIG. 4. A shallow trench 111 is formed in the surface of the silicon substrate 100 of one conductivity type, for example, P-type, and a device isolation region or STI (Shallow Trench Isolation) 113 which constitutes the device forming region 102 is formed by burying an insulating layer 112 in the shallow trench 111, thereby defining the device forming region 102. A tunnel oxide layer 114 comprised of a thermal oxidation silicon oxide layer with a thickness 10 nm is formed at the surface of the device forming region 102 of the P-type silicon substrate 100 which is defined by the STI 113, and the floating gate FG of polysilicon doped with an impurity, such as phosphorus, having a thickness of 120 nm or so is formed on the tunnel oxide layer 114. The floating gate FG is formed as long as possible with such a size as not to short-circuit the gates adjoining in the row direction, and its both end portions extend from the device forming region 102 to a part of the STI 113. An N-type impurity is doped in areas in the device forming region 102, which hold the floating gate FG in the column direction, forming the source region S and the drain region D.

Formed at the surface of the silicon substrate 100 including the surface of the floating gate FG is a so-called ONO (Oxide-Nitride-Oxide) layer 116 as a capacitance insulating layer which has a silicon oxide layer/silicon nitride layer/silicon oxide layer in order with thicknesses of 5 nm/5 nm/9 nm. The control gate CG extending in the row direction over a plurality of floating gates FG adjoining in the row direction is formed on the capacitance insulating layer 116 as a word line W. This control gate CG is formed of conductive polysilicon having a thickness of 160 nm or so. In FIGS. 5A and 5B, though not illustrated, an interlayer insulating layer is formed on the word line W, and the bit line B connected to the source region S via the source contacts SC as shown in FIG. 4 is formed on the interlayer insulating layer, thereby constituting the circuit in FIG. 3.

Figure 6A:
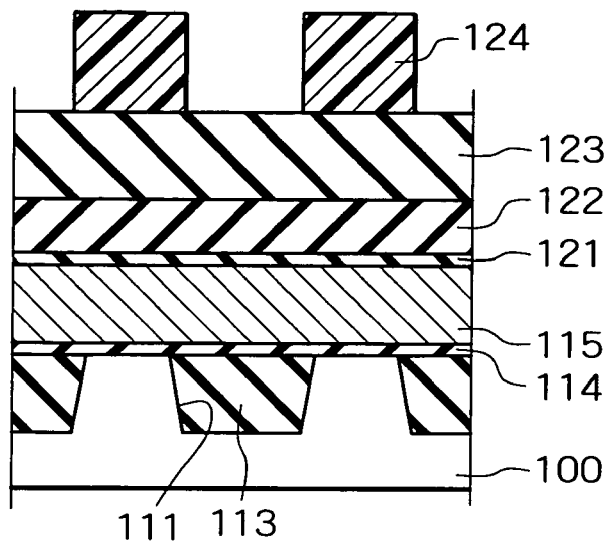
FIGS. 6A to 6C are cross-sectional views illustrating a fabrication method according to the invention process by process.

Next, a fabrication method for the semiconductor memory device with the above-described structure is described referring to FIGS. 6A to 8B. Like FIG. 5A, those diagrams show a cross-sectional structure along line A—A in FIG. 4. First, as shown in FIG. 6A, the STI 113 is formed in the P-type silicon substrate 100, thereby defining the device forming region 102. The method of fabricating the STI 113 is well known. For example, the shallow trench 111 is selectively formed in a lattice pattern formed at the surface of the silicon substrate 100 using a photoresist, and a silicon oxide layer 112 sufficient to bury the shallow trench 111 is deposited by CVD or so (see FIG. 5A). Then, the deposited CVD silicon oxide layer 112 is polished by CMP (Chemical Mechanical Polishing) until the surface of the silicon substrate 100 is exposed from the top surface, thereby forming the STI 113 having the CVD silicon oxide layer 112 buried only in the shallow trench 111.

Next, the surface of the silicon substrate 100 is thermally oxidized to grow a thermal oxidation silicon oxide layer, thereby forming the tunnel oxide layer 114 of 10 nm in thickness. Further, phosphorus-contained first polysilicon layer (doped polysilicon) 115 is grown on the tunnel oxide layer 114 to a thickness of 120 nm by CVD. Then, the surface of the first polysilicon layer 115 is thermally oxidized to form an extremely thin silicon oxide layer as a protective layer 121 having a thickness of 2 nm or so. A laminated mask layer is formed on the protective layer 121 for formation of a hard mask. As a lower layer, a silicon nitride layer 122 having a thickness of at least 30 nm, 50 nm in this case, is grown by CVD. As an upper layer, a silicon oxide layer undoped with an impurity or so-called NSG layer 123 is formed to a thickness of 150 nm or greater by CVD.

Next, a photoresist pattern (PR pattern) 124 for formation of the floating gate is formed on the NSG layer 123. The photoresist pattern 124 is formed in such a way that the are of the floating gate FG to be formed becomes as large as possible and the interval between photoresist patterns adjoining in the row direction becomes as small as the resolution limit of the photolithography technology.

Figure 6B:
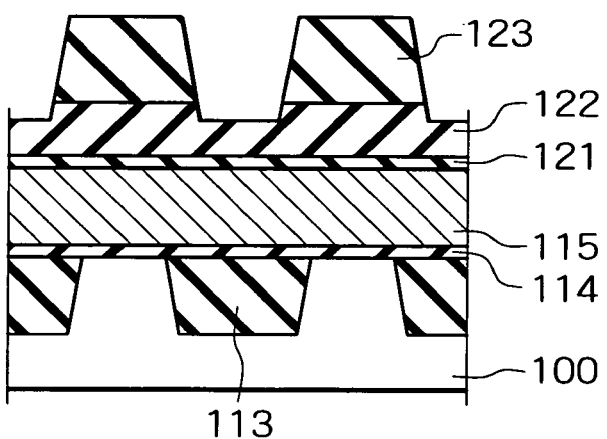

Then, as shown in FIG. 6B, the NSG layer 123 or the upper layer of the laminated mask layer is etched using the photoresist pattern 124. At this time, the surface of the silicon nitride layer 122 or the lower layer is slightly etched, but serves as an etching stopper for the NSG layer 123. Thereafter, the photoresist pattern 124 is removed.

Figure 6C:
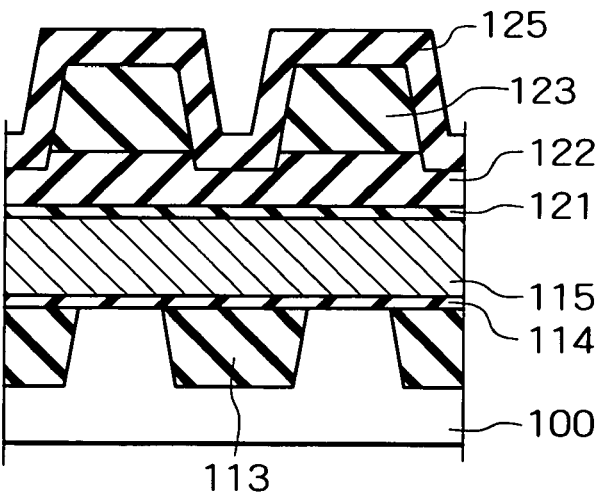

Next, as shown in FIG. 6C, a second NSG layer 125 is grown on the entire surface to a thickness of 60 nm or so by CVD. The second NSG layer 125 is integrated with the upper layer of the laminated mask layer or the NSG layer (hereinafter called "first NSG layer") 123. Then, the second NSG layer 125 is dry-etched by plasma etching or so.

As a result, the second NSG layer 125 is left as a side wall 125a on both side surfaces of the first NSG layer 123 by anisotropic etching. The pattern size of the first NSG layer 123 with which the remaining side wall 125a is integrated is increased by the thickness of the side wall 125a toward both sides in the row direction. This makes the interval between the patterns adjoining in the row direction become shorter than the resolution of the photolithography technology. This dry etching etches the lower layer or the silicon nitride layer 122 to the same size as the pattern having both the first NSG layer 123 and side wall 125a.

Figure 7A:
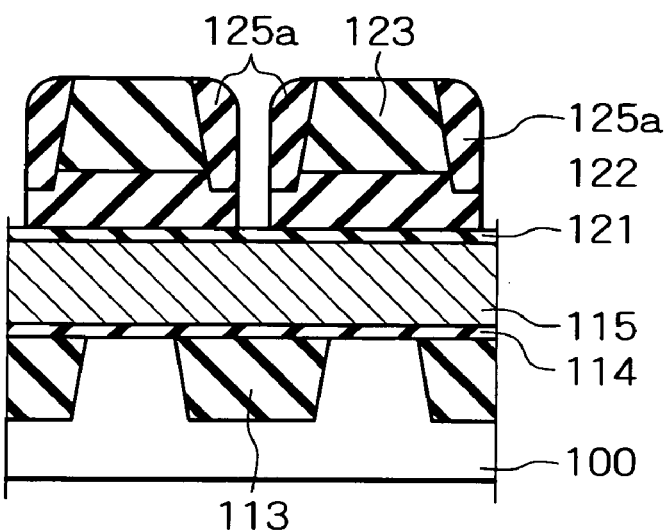
FIGS. 7A to 7C are cross-sectional views illustrating a fabrication method according to the invention process by process and respectively showing processes following the process of FIG. 6C.
Figure 7B:
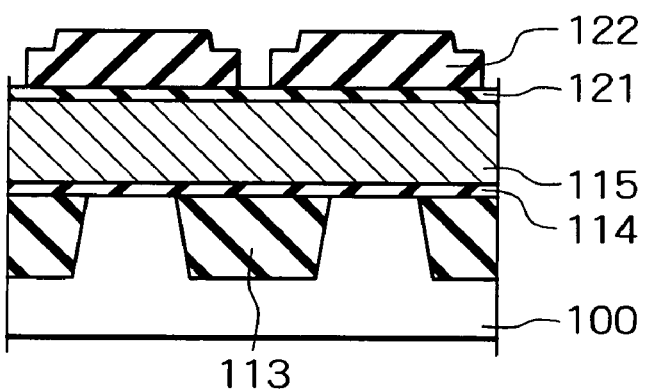
Figure 7C:
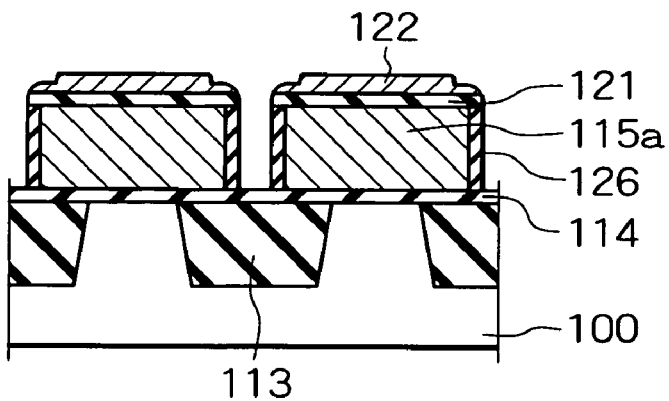

Next, as shown in FIG. 7B, the first NSG layer 123 and the side wall 125a are removed by wet etching. Then, with the remaining silicon nitride layer 122 used as a mask, the protective layer 121 is etched followed by dry etching of the first polysilicon layer 115 into the same pattern as the silicon nitride layer 122. As a result, a first polysilicon layer pattern 115a is formed as shown in FIG. 7C. At this time, the silicon nitride layer 122 which serves as a laminated hard mask is etched to some extent, so that its thickness becomes smaller. After etching, the resultant structure is thermal oxidized at a low temperature of 700° C. or so, thereby forming a thin thermal oxidation silicon oxide layer 126 on the exposed side surface of the first polysilicon layer pattern 115a. Thereafter, the silicon nitride layer 122 which has been used as a mask is wet-etched in a phosphoric acid solution. At this time, the first polysilicon layer pattern 115a is protected by the thermal oxidation silicon oxide layer as the protective layer 121 formed on the top surface and the thermal oxidation silicon oxide layer 126 formed on the side surface and is prevented from being damaged by the phosphoric acid solution. Execution of sufficient etching with the phosphoric acid solution prevents a part of the silicon nitride layer 122 from being left on the first polysilicon layer pattern 115a.

Figure 8A:
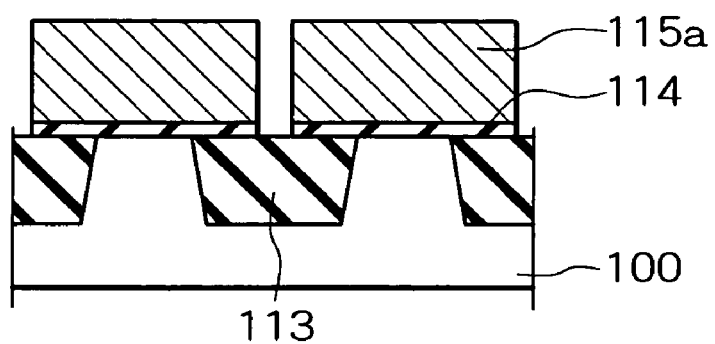
FIGS. 8A and 8B are cross-sectional views illustrating a fabrication method according to the invention process by process and respectively showing processes following the process of FIG. 7C.

Next, as shown in FIG. 8A, the thermal oxidation silicon oxide layer 121 exposed through the top surface of the first polysilicon layer pattern 115a and the thin thermal oxidation silicon oxide layer 126 formed on the side surface of the first polysilicon layer pattern 115a are wet-etched to expose the surface of the first polysilicon layer pattern 115a. Because the first polysilicon layer pattern 115a formed in this manner is formed in the same pattern as the silicon nitride layer 122 as the hard mask or the pattern of the laminated mask layer including the first and NSG layers 123 and 125, the interval between first polysilicon layer patterns 115a adjoining in the row direction is made smaller than the resolution of the photolithography technology by the size equivalent to the thickness of the side wall comprised of the second NSG layer 125.

Figure 8B:
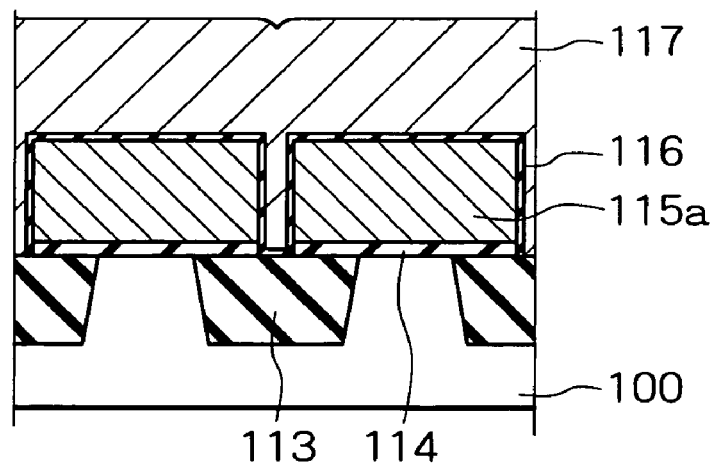

Next, as shown in FIG. 8B, the ONO layer 116 as a capacitance insulating layer is formed on the entire surface including the surfaces of the first polysilicon layer pattern 115a and the silicon substrate 100 by CVD, and a second polysilicon layer 117 is formed on the ONO layer 116. The ONO layer 116 is formed by laminating a silicon oxide layer, a silicon nitride layer and a silicon oxide layer in order to the desired thickness by CVD. In this example, the ONO layer 116 is formed to have a thickness of 5 nm/5 nm/9 nm.

Then, a photoresist pattern extending in the column direction at a desired interval in the row direction (not shown) is formed on the second polysilicon layer 117 at an area including the device forming region 102, and using the photoresist pattern, the second polysilicon layer 117, ONO layer 116 and first polysilicon layer pattern 115a are etched in order. As a result, a word line W as the control gate CG is formed by the second polysilicon layer 117 and the floating gate FG is formed by the ONO layer 116 directly under the word line W through the ONO layer 116.

Thereafter, referring also to FIG. 5B, ions of an N-type impurity, such as arsenic, are injected into the surface of the silicon substrate 100 at the device forming region 102 using the word line W as a mask, thus forming the N-type source region S and drain region D. Then, an interlayer insulating layer 118 is formed on the entire surface and a contact hole which reaches the source region S is bored in the interlayer insulating layer 118, a conductive material is buried in the contact hole to form a contact plug 119. Then, a bit line B extending in the column direction is formed on the interlayer insulating layer 118 and is connected to the source region via the contact plug 119. This completes a memory cell having the layout structure shown in FIG. 4.

With memory cells fabricated by the above-described fabrication processes, even in case where the pattern of the first NSG layer 123 as the laminated hard mask layer is formed to the size close to the resolution limit of the photolithography technology, the laminated hard mask having the side wall 125a formed by the second NSG layer 125 is formed on both sides of the first NSG layer 123 in a process in FIG. 7A. This makes it possible to narrow the interval between the adjoining laminated hard masks to be equal to or smaller than the resolution, so that the row-directional size of the floating gate FG, formed by the laminated hard mask, can be increased accordingly. Accordingly, the floating gate FG increases the area opposite to the control gate CG, thus increasing the capacitor therebetween, thus making it possible to manufacture memory cells which can be adequately programmed.

Because of the formation of a thermal oxidation silicon oxide layer as the protective layer 121 on the first polysilicon layer 115, the formation of the silicon nitride layer 122 as the lower layer of the laminated mask on the thermal oxidation silicon oxide layer, and the formation of the thin thermal oxidation silicon oxide layer 126 on the exposed side surface of the first polysilicon layer pattern 115a formed by etching the first polysilicon layer 115 by the laminated hard mask in the process in FIG. 7C, the phosphoric acid solution as an etchant does not contact the surface of the first polysilicon layer pattern 115a at the time of etching out the silicon nitride layer 122 after the formation of the first polysilicon layer pattern 115a, preventing the surface of the first polysilicon layer pattern 115a from being damaged. Therefore, the surface of the floating gate FG fabricated finally is not damaged, and the uniform and flat surface is maintained to provide a stable and even capacitance.

At the same time, no damage is made even if doped polysilicon is used for the first polysilicon layer 115. This eliminates the need for a later process of injecting an impurity, and can reduce the number of fabrication processes. In case where a part of the NSG layer remains as a foreign matter (deposition) on the surface of the silicon nitride layer 122 at the time of etching the first and second NSG layers 123 and 125 as the upper layer of the laminated hard in the previous process, or in case where part of polysilicon at the time of etching the first polysilicon layer 115 sticks on the surface of the silicon nitride layer 122 as a foreign matter, sufficient etching of the silicon nitride layer 122 in the process in FIG. 7C can surely remove the foreign matter and there is no etching residual on the silicon nitride layer 122 when this process ends. This makes it possible to form the ONO layer 116 uniformly with a high quality in a later process in FIG. 8B.

Figure 9A:
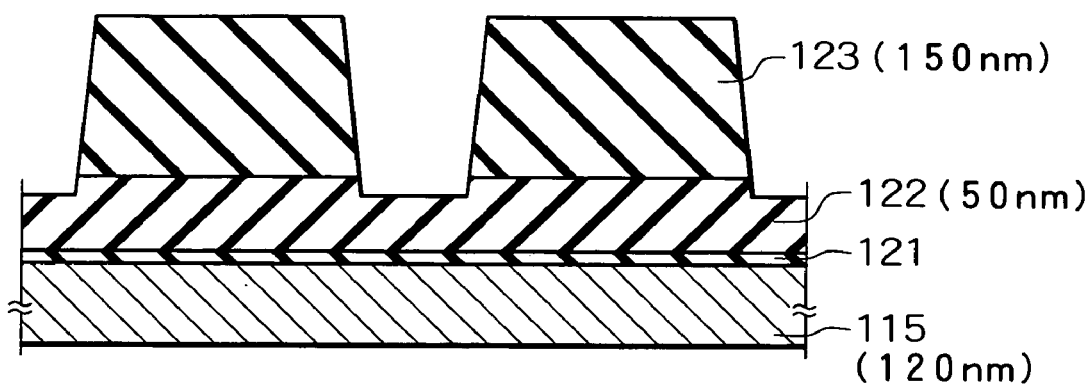
FIGS. 9A and 9B are exemplary cross-sectional views illustrating the advantage brought about by the thickness of a silicon nitride layer.
Figure 9B:
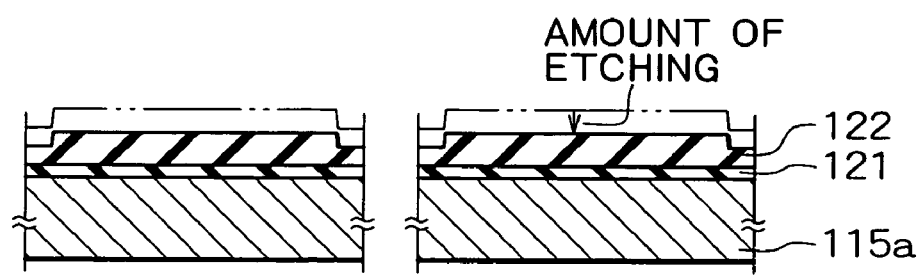

Further, according to the embodiment, the thickness of the silicon nitride layer 122 as the lower layer of the laminated hard mask is set equal to or greater than 50 nm and the thickness of the overlying first NSG layer 123 is set to 150 nm and the thickness of the first polysilicon layer 115 is set to 120 nm. As exemplarily illustrated in FIG. 9A, such setting of the layer thickness and the thickness range causes the thickness of the silicon nitride layer 122 to be greater than the sum of the etching amount (approximately 10 nm) by which the surface of the silicon nitride layer 122 is etched at the time of etching the first NSG layer 123 and the etching amount (approximately 20 nm) by which the silicon nitride layer 122 is etched at the time of etching the first polysilicon layer 115 using the silicon nitride layer 122 as a mask. Accordingly, even through those processes, the silicon nitride layer 122 surely remains on the first polysilicon layer 115 as shown in FIG. 9B, making it possible to reliably etch the first polysilicon layer 115 to a pattern with the intended size. Particularly, those portions of the silicon nitride layer 122 which are etched when etching the first NSG layer 123 are equivalent to both shoulder portions of the patterned first polysilicon layer pattern 115a, so that setting the aforementioned thickness can keep the thicknesses at the steps formed at both shoulders of the silicon nitride layer 122 and prevent the size of the first polysilicon layer pattern 115a formed from varying.

In the embodiment, the thickness of the first NSG layer 123 as the upper layer of the laminated hard mask is set to 150 nm and the thickness of the overlying second NSG layer 125 for the formation of a side wall is set to 60 nm. Setting the thickness of the first NSG layer 123 twice the thickness of the second NSG layer 125 or greater allows the side surface of the second NSG layer 125 grown on the side surface of the first NSG layer 123 to be formed as a perpendicular surface, as indicated by the broken line in FIG. 10A. Accordingly, when the second NSG layer 125 is subjected to anisotropic etching to form the side wall 125a, as indicated by the solid line in FIG. 10A, etching at the perpendicular side surface of the second NSG layer 125 can be suppressed, preventing the side surface of the second NSG layer 125 from etched back in the horizontal direction. This prevents a variation in the size of the hard mask comprised of the lower layer or the silicon nitride layer 122. This means that if at least the thickness of the first NSG layer 123 is equal to or greater than the thickness of the second NSG layer 125, theoretically, etch-back of the side surface of the second NSG layer 125 can be restrained. If the thickness of the first NSG layer 123 is twice the thickness of the second NSG layer 125 or greater as in the embodiment, therefore, etch-back of the side surface of the second NSG layer 125 can be restrained. In case where the first NSG layer 123 is thinner than the second NSG layer 125, the side surface of the second NSG layer 125 is tapered so that the side surface of the second NSG layer 125 is etched back by the later etching, thus making it possible to acquire the interval between the gates which is equal to or smaller than the resolution of the photolithography technology by using the side wall 125a.

In the invention as described above, a layer of a material other than NSG used in the embodiment can be used as the upper layer for forming the laminated hard mask. Particularly, the upper layer has only to be formed of a material which has etching selectivity with respect to the lower layer; for example, it may be a polysilicon layer while the NSG layer is used because the lower layer is a silicon nitride layer in the embodiment. In case where a layer of a material other than silicon nitride is used as the lower layer, the upper layer can further be formed of a different material. The silicon layer which constitutes the floating gate and control gate is not limited to a polysilicon layer but a polyside layer or a metal silicide layer can be used as well.

What is claimed is:

1. A method of fabricating a stacked-gate nonvolatile semiconductor memory device having a floating gate and a control gate, including the steps of:
    forming a tunnel insulating layer in a device forming region defined in a semiconductor substrate;
    forming an impurity-doped silicon layer on said tunnel insulating layer;
    forming a protective layer at a surface of said silicon layer;
    laminating a lower layer and an upper layer of a laminated mask layer on said protective layer in order;
    forming said upper layer into a desired pattern;
    forming a second upper layer on said pattern of said upper layer;
    etching said second upper layer and leaving said second upper layer only on a side surface of said first upper layer;
    etching said lower layer using said first and second upper layers as masks;
    forming a silicon pattern by etching said silicon layer using said lower layer as a mask;
    forming a second protective layer 121 covering a surface of said silicon pattern exposed; and
    etching out said lower layer.

2. The fabrication method according to claim 1, further including the steps of:
    removing said protective layer present at the surface of said silicon pattern after the step of etching out said lower layer;
    forming a capacitance insulating layer at the surface of said silicon pattern;
    forming a conductive layer on said capacitance insulating layer; and
    forming a control gate with said conductive layer and forming a floating gate with said silicon pattern by etching said conductive layer, said capacitance insulating layer and said silicon pattern in order into a desired pattern.

3. The fabrication method according to claim 1, wherein said silicon layer is a polysilicon layer or a metal polyside layer.

4. The fabrication method according to claim 2, wherein said silicon layer is a polysilicon layer or a metal polyside layer.

5. The fabrication method according to claim 3, wherein said lower layer is a silicon nitride layer and said first and second upper layers are silicon oxide layers.

6. The fabrication method according to claim 4, wherein said lower layer is a silicon nitride layer and said first and second upper layers are silicon oxide layers.

7. The fabrication method according to claim 1, wherein said protective layer is a thermal oxidation silicon oxide layer obtained by subjecting the surface of said polysilicon layer to a heat treatment.

8. The fabrication method according to claim 1, wherein said silicon nitride layer is etched out by a phosphoric acid solution.

9. The fabrication method according to claim 8, wherein a thickness of said silicon nitride layer is set greater than a sum of a thickness of said silicon nitride layer to be etched and a thickness of said silicon nitride layer to be etched at a time of etching said polysilicon layer.

10. The fabrication method according to claim 9, wherein a thickness of said first upper layer is set greater than a thickness of said second upper layer.

11. The fabrication method according to claim 10, wherein said thickness of said first upper layer is equal to or greater than twice said thickness of said second upper layer.

* * * * *